United States Patent [19]

Zwicker et al.

[11] Patent Number: 4,868,881
[45] Date of Patent: Sep. 19, 1989

[54] METHOD AND SYSTEM OF BACKGROUND NOISE SUPPRESSION IN AN AUDIO CIRCUIT PARTICULARLY FOR CAR RADIOS

[75] Inventors: Eberhard Zwicker, Icking; Klaus Deuter, Freising, both of Fed. Rep. of Germany

[73] Assignee: Blaupunkt-Werke GmbH, Hildesheim, Fed. Rep. of Germany

[21] Appl. No.: 239,783

[22] Filed: Sep. 1, 1988

[30] Foreign Application Priority Data

Sep. 12, 1987 [DE] Fed. Rep. of Germany ....... 3730763

[51] Int. Cl.$^4$ .......................... H03G 3/00; H03G 3/20
[52] U.S. Cl. ...................................... 381/107; 381/57; 381/86; 381/94; 381/103; 381/106
[58] Field of Search .................... 381/57, 86, 94, 103, 381/106, 107

[56] References Cited

U.S. PATENT DOCUMENTS

| | | | |
|---|---|---|---|
| 4,254,303 | 3/1981 | Takizawa | 381/107 |
| 4,380,824 | 4/1983 | Inoue | 381/86 |
| 4,430,754 | 2/1984 | Ishigaki | 381/107 |
| 4,476,571 | 10/1984 | Tokumo et al. | 381/57 |
| 4,553,257 | 11/1985 | Mori et al. | 381/57 |
| 4,641,344 | 2/1987 | Kasai et al. | 381/86 |
| 4,641,361 | 2/1987 | Rosback | 381/103 |
| 4,688,258 | 8/1987 | Kunugi et al. | 381/107 |

FOREIGN PATENT DOCUMENTS 2231647 1/1974 Fed. Rep. of Germany .
2456445 8/1976 Fed. Rep. of Germany .
244200 8/1946 Switzerland .

Primary Examiner—Jin F. Ng
Assistant Examiner—David H. Kim
Attorney, Agent, or Firm—Frishauf, Holtz, Goodman & Woodward

[57] ABSTRACT

To improve the fidelity of reproduction of automobile radios during conditions of extraneous in the passenger compartment, noise signals are derived, for example from a microphone installed in the engine compartment of the vehicle. The audio program signals are conducted through a multichannel equalizer; the program audio signals and the noise signals are separated into a plurality of frequency bands, for example three bands, the envelope of which are demodulated and the derived demodulation signals are instantaneously compared to then control the transfer characteristics of the respective bands of the equalizer in accordance with the derived comparison between the respective bands of the noise and program signals. Preferably, amplitude, change of transfer amplitude and rate of change is controlled by weighting the comparison signals and the rate of change thereof in relation to the frequency bands and the extent of change of the signals.

12 Claims, 4 Drawing Sheets

METHOD AND SYSTEM OF BACKGROUND NOISE SUPPRESSION IN AN AUDIO CIRCUIT PARTICULARLY FOR CAR RADIOS

The present invention relates to suppression of reproduction of background noises when acoustic signals are derived from electrical audio signals, and more particularly to improving the audio reproduction of automobile radios in which the listening area, particularly the passenger compartment of the autombile, is subject to extraneous noise.

BACKGROUND

During reproduction of radio programs, tape-recorded programs, and the like, by a car radio it frequently happens that the audio signal reproduced by the loud speakers of the car radio is subject to extraneous noise inteference of widely varying loudness or amplitude. Such extraneous noise is superimposed above the audio program which is intended to be heard, the audio program being entirely or partially masked by the extraneous noise.

Extraneous noise depends on various factors, for example speed of the vehicle, its construction, the quality of noise insulation, the inner appointment of the passenger compartment, the number of passengers in the passenger compartment, ventilation of the passenger compartment, the position of windows, whether open or closed, air-conditioning apparatus including its fan or ventilator, and the like. Any change in any one of the above parameters usually leads the listener to readjust the volume control of the car radio, for increased or decreased volume. If the driver is the only operator of the car radio, this is frequently difficult because the driver has to pay attention to road and traffic conditions, and may require both hands for guidance and control of the vehicle; various operating conditions of vehicles do not permit simultaneously driving and operating a radio button. Additionally, the volume of the reproduced signal varies frequently with respect to the volume of the noise signal so rapidly that manual control is practically impossible.

The audio signal is reproduced with the fidelity characteristic of the electronic reproduction apparatus. High-quality car radios provide high fidelity outputs. Noise during passage of a piano concert, easily masks the particular passage. The volume of reproduction should thus be raised upon acceleration of the vehicle in order to permit the piano passage to be readily perceptible. Even if the noise is at a level such that the piano passage still can be heard, the music sounds distorted.

It has previously been proposed to provide automatic volume control for vehicles in which a controller receives an input based on vehicle speed and/or engine speed. It also been proposed to install a microphone or similar apparatus in the engine compartment of the vehicle in order to measure engine noise and to then cotrol the volume of reproduction as a function of engine noise.

A microphone installed in the engine compartment of the vehicle does not pick up all noises which occur, and referred to above. As a first approximation, however, engine noise may be considered the primary disturbance factor having the widest noise dynamics and the widest rate of change of its amplitude during operation of a car radio.

THE INVENTION

It is an object to so improve a car audio system that the reproduction of a program signal will be less subject to noise disturbance than heretofore.

Briefly, a multi-channel equalizer is inserted in the path of the program signal. The equalizer, as well known, has a plurality of channels, subdivided into frequency bands, which channels are individually adjustable. The program signal is separated into a plurality of frequency bands or components, typically three frequency bands or components and corresponding, for example, to the frequency bands of a three-channel equalizer. A noise signal is derived, for example from a microphone installed in the engine department of the vehicle which, likewise, is subdivided by bandpass filters into frequency bands having the same band width as the band width of the subdivided program signal. The noise signal bands and the program signal bands are then divided into each other, in other words compared, and individual separate control signals, corresponding to the respective frequency bands, are then derived which, in a control stage, provide control output signals for the control inputs of the equalizer to control the transfer amplitude of the respective channels of the equalizer with respect to level of transfer amplitude, change of transfer amplitude, and rate of change of transfer amplitude, all as a function of the comparison signals.

The system and method has the advantage that the program signal is selectively controlled with respect to its frequencies so that only those frequency ranges which are masked by noise are increased in amplitude; if specific frequency ranges are not affected by noise, their amplitude can be reduced. Control of the reproduction amplitude, thus, is frequency-selective.

In accordance with a preferred feature of the invention, the electrical noise signal is derived from a microphone located in the engine compartment of the veihcle. Other sources of noise signals may be used without departing from the scope of the present invention:

Drawing, illustrating embodiments of the invention

DETAILED DESCRIPTION

Figure 1:
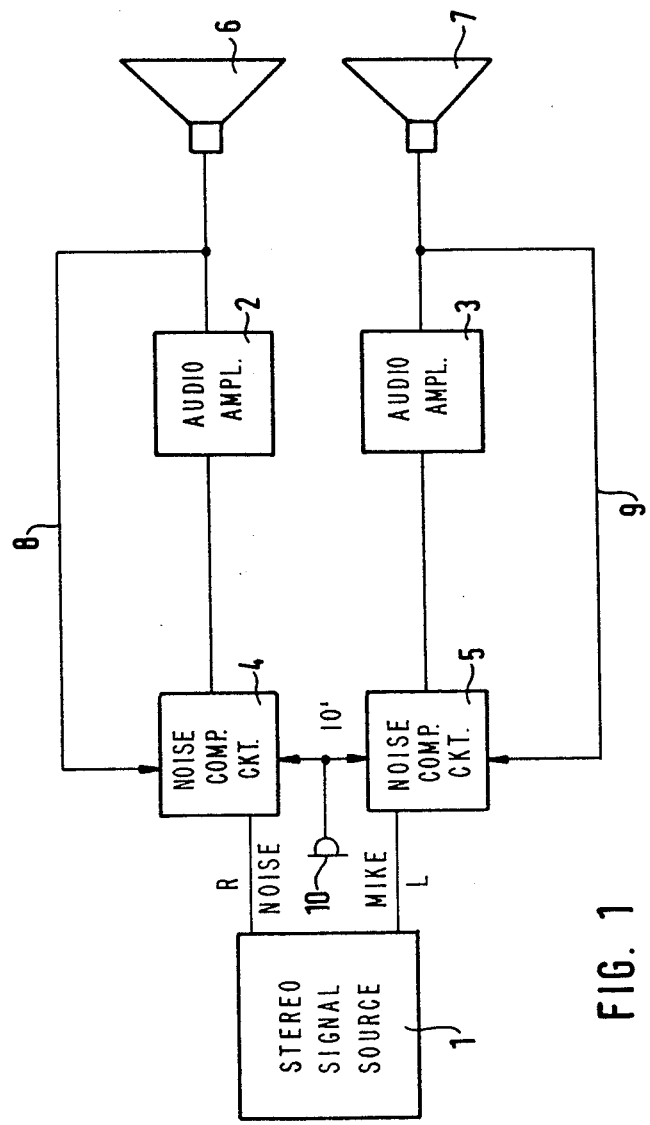
FIG. 1 is a basic block circuit diagram of the system in accordance with the present invention.

A stereo signal source 1 which, for example, may be a car radio, a tape deck, or the like, is coupled through two channels R, L for right and left stereo channels, respectively, to a two-channel audio amplifier 2, 3 to feed respective loudspeakers 6, 7. The stereo signal source 1 provides stereo program audio signals for reproduction by the loudspeakers 6, 7.

Noise compensation circuits 4, 5 are interposed in the signal paths of the respective channels R, L. Measuring feedback lines 8, 9 connect from the audio amplifiers 2, 3 to the respective noise compensation circuits 4, 5. A noise pick-up or microphone 10 is provided, picking up electrical noise signals which are applied to the noise compensation circuits 4, 5.

In accordance with the present invention, the levels of the noise signals available at terminal 10' and the program audio signals from the signal source 1 are compared in respective frequency bands and, in accordance with a preferred embodiment of the invention, in three separate individual frequency bands. Three associated control circuits then receive the differences in level between program audio signals and noise signals. The control system is so arranged that differences in level between the program audio signals and the noise signals are maintained in a temporal average at predetermined levels which can be adjusted and controlled with respect to the specific channels associated with each frequency band. This permits associating the audio programming signal with the frequency spectrum and the level of the disturbance or noise signals, although the dynamics of the programming signals may also be somewhat reduced.

Figure 2:
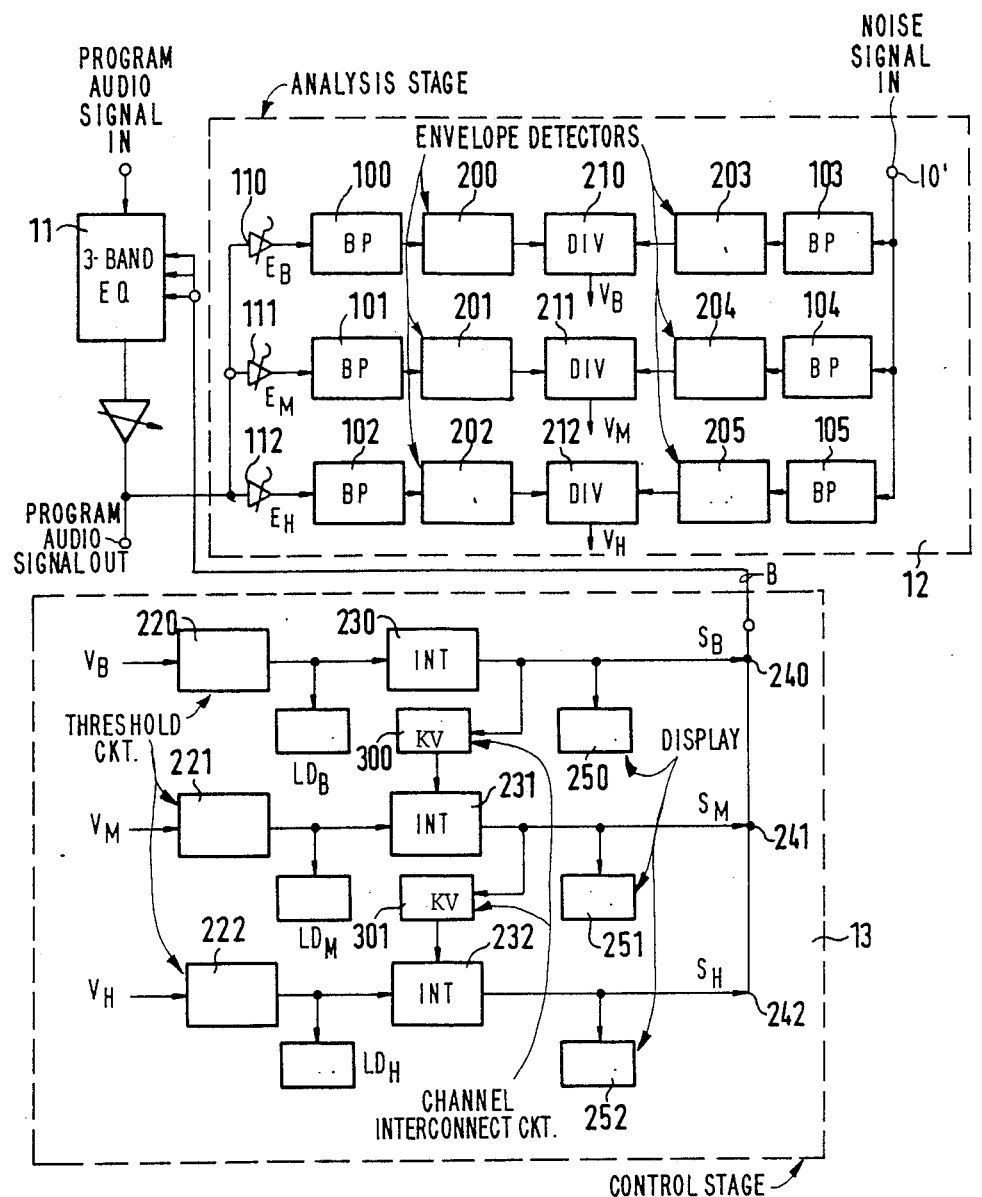
FIG. 2 is a detailed block diagram of an analysis stage and a control stage for control of an equalizer in the signal path of a car radio.

The respective circuits 4, 5 are shown in detail in FIG. 2. Each one of the noise compensation circuits 4, 5 includes a three-band equalizer 11 in the signal path between the program audio signal input and the program audio signal output. A controlled amplifier, shown only schematically, is serially connected with the equalizer 11. The noise compensation circuit further comprises a signal analysis stage 12 and a control stage 13. The signal analysis stage 12 has three octave bandpass circuits 100, 101, 102, receiving the output signal from the threeband equalizer through respective calibrating amplifiers or circuits 110, 111, 112. Similar bandpass filters 103, 104, 105 are connected to terminal 10', for example through a suitable amplifier (not shown). The bandpass filters 103-105 likewise pass in three octave bands. Envelope detectors 200, 201, 202 and 203, 204, 205 are, respectively, connected to the outputs of the respective bandpass circuits 100-102 and 103-105 for the noise signals. The output signals from the envelope detectors are connected in the respective frequency band channels to analog dividers 210, 211, 212 for comparison of the amplitudes of the signals from the respective envelope detectors.

The control stage 13 receives as its input, for each frequency band, a threshold circuit 220, 221, 222, in which the output signal from the analog dividers 210, 211, 212 is compared with predetermined thresholds. Each threshold corresponds to a different speed or rate of change of the voltage at the ouputs 240, 241, 242 of integrators 230, 231, 232 connected to the outputs of the threshold circuits 220, 221, 222. The value of the voltages can be indicated and shown on a display 250, 251, 252 for each one of the frequency band channels. The output signals at terminals 240, 241, 242 form a control signal for the control elements of the three-band equalizer and are connected thereto by a suitable cable B.

The equalizer, which is controlled by d-c control signals, permits separate control of three frequency bands with separating frequencies at 300 Hz and 2000 Hz. When all the control inputs to the equalizer have zero voltage signals thereon, the overall damping, independent of frequency, is 20 dB. Starting with this overall damping, and band-selective, the damping of 20 dB can be decreased so that, when all the control inputs to the equalizer have maximum voltage thereon, a frequency-independent damping of 0 dB between the input and output of the equalizer will be in the path of the program audio signal. A typical equalizer is linear, with a sensitivity of 2 dB per volt, so that a control signal varying between 0 and 10 volts provides for frequency-dependent transfer of the program signals through the equalizer in accordance with the respective control voltages supplied to the control inputs thereof.

The analysis stage likewise has three channels, with separating frequencies at 300 Hz and 2000 Hz. These separating frequencies, determined by the bandpass filters 100-102 and 103-105 are the same both for the program signal as well as for the noise signal.

OPERATION

The program audio signal is transmitted to the analysis stage over three calibration circuits 110, 111, 112, to be then connected to the respective bandpass circuits 100, 101, 102. The calibration circuits 110, 111, 112 are controllable in 2 dB steps for damping between 0 to 18 dBd and are used to set the average level differences. The bandpass circuits 100-102 are octave bandpass circuits with center frequencies of 100 Hz for the bass channel, 700 Hz for a midrange channel, and 4400 Hz for the high, or treble channel. The bandpass filters, thus, are octave bandpasses of the fourth degree. The subsequent envelope detectors 200-202 and 203-205 provide for full-wave rectification; the signals are weighted with signal rise and signal decay time constants. The signal rise and signal decay time constants are optimized for the respective demodulators with respect to frequency and the characteristics of the signal. A suitable optimization are time constants in accordance with Table 1.

Reference to Table 1, forming part of this specification, shows that the rise time of the envelope detectors 200-202 and 203-205 for both signals is short with respect to the decay time; and that the decay periods in the higher frequency bands are shorter than in the lower frequency bands.

The noise signal applied to terminal 10' is directly connected, possibly after suitable amplification, to the octave bandpass circuits 103-105. The time constants of the envelope detectors connected to the bandpass circuits 103-105 differ from the time constants of the envelope detectors for the program audio signal, as clearly seen in Table 1. The envelopes derived from the program audio signal and from the noise signal are then divided between each other in analog dividers 210-212 in order to evaluate the level differences between the signals connected to the dividers. In the dividers, the instantaneous signal amplitude of the program audio signal is compared with the instantaneous signal amplitude of the envelope of the noise signal. The respective amplitude relationships then form control signals $V_B$ for the bass channel, $V_M$ for the mid-range channel and $V_H$ for the high, or treble channel. Connecting lines between the dividers of the analysis stage 12 and subsequent circuits in the control stage 13 in FIG. 2 have been omitted for clarity of the drawing, with the terminals merely having been equally labelled.

The control stage 13 has three threshold circuits 220, 221, 222, respectively for the bass, mid-range and high, or treble channels. The control stage further includes integrators 230, receiving the outputs from the threshold circuits, and similar integrators 231, 232 channelinterconnect circuits 300, 301, and output displays 250, 251, 252. Intermediate displays formed by light-emitting diodes $LD_B$, $LD_M$ and $LD_H$ are provided. The output control signals $S_B$, $S_M$ and $S_H$ are available at respective terminals 240, 241, 242 which are connected by a multiline cable B to the control inputs of the three-band equalizer.

Figure 3:
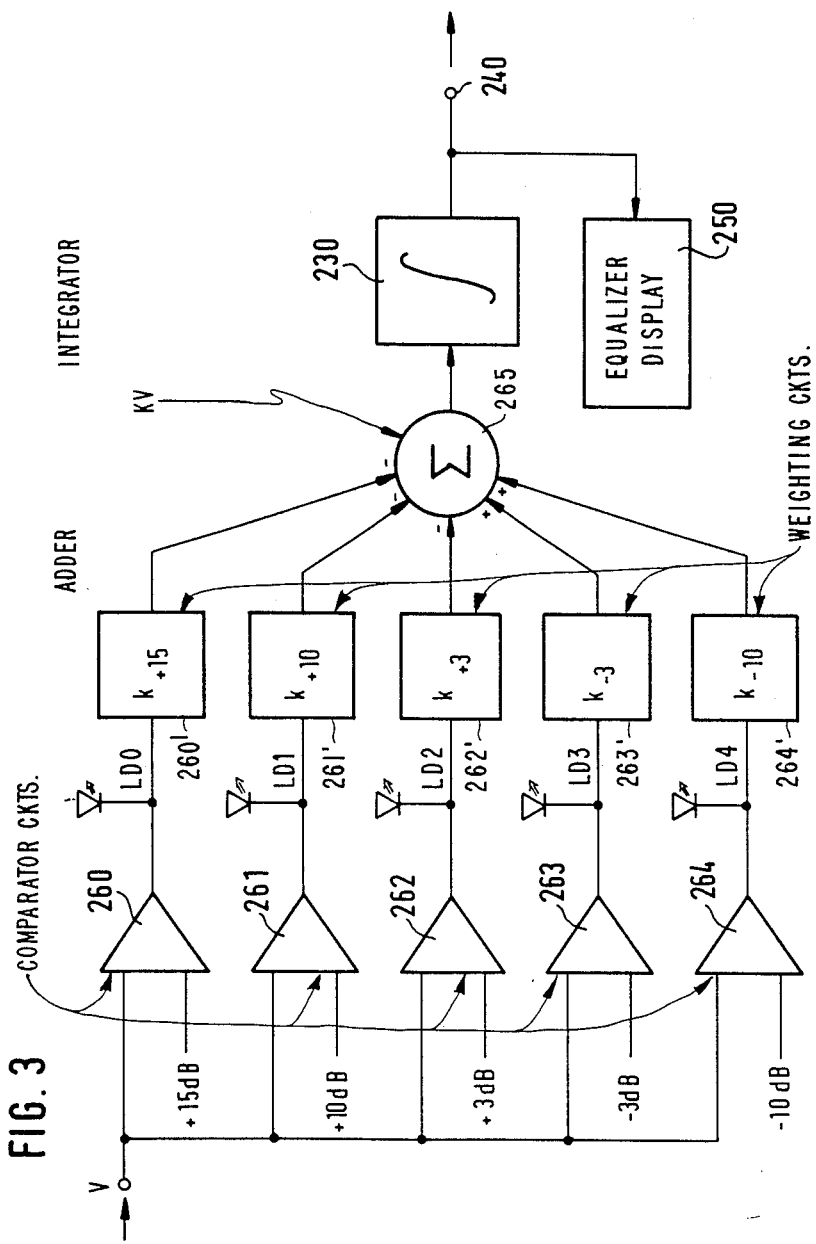
FIG. 3 is a detailed schematic block diagram of a portion of the control stage of FIG. 2.

Any one of the threshold circuits 220, 221, 222 (FIG. 2) of the control stage are shown in detail in FIG. 3. The output voltage from the respective divider 210, 211, 212, and shown merely as voltage V in FIG. 3, is compared in a five-stage comparator 260–264 with five threshold levels, which correspond to level differences between the program audio signal and the disturbance signal of, respectively, 15 dB, 10 dB, 3 dB, −3 dB and −10 dB. The five individual comparators, typically operational amplifiers, control respective light-emitting diodes (LEDs) LD0–LD4 for optical supervision of the operation of the circuit. The output signals of the five comparators are weighted with factor $k_i$ and added in the adder 265, with the corresponding sign, to be then integrated in integrator 230. Integrator 230, upon response of any one of the comparators, changes its output voltage with a speed or at a rate which corresponds to the respective weighting factor $k_i$, introduced in the weighting circuits 260', 261', 262', 263', 264'.

Suitable values for factors $k_i$, in dB per second, which results in the respective speed of change of damping in the controlled equalizer, is shown in Table 2, for an optimized circuit.

As can be clearly seen, the speed of change from +10 dB and −10 dB should be selected to be substantially higher than if other signal conditions prevail.

The equalizer display 250, fed by the integrator output 230, is a 10-division LED scale and shows the actual damping of the equalizer in ten steps of 2 dB each between −20 dB to 0 dB damping.

Some disturbance noises have a substantial low frequency component. This may result in low damping of the bass channel or, in other words, controlling the equalizer to have minimum damping in the base channel, whereas the mid-range and high, or treble channels retain their overall 20 dB damping. This results in an undesired, "booming" type of reproduction. Tone compensation interconnect circuits 300, 301 (FIG. 2) sense substantial decrease in damping of the equalizer of the respective bass and mid-range channels and then control the respective mid-range and high, or treble channels for lesser damping as well. Fixed relationships of decrease in damping or rise in output amplitude can be set between the respective B and M channels, for example of from 10 to 3 dB; and between the M and H channels, for example from 10 to 7.25 dB. This means, for example, that if the base channel is raised by 20 dB, the mid-range channel, due to the interconnection, will be opened by 6 dB; and the high, or treble channel will be opened by about 4.5 dB.

Figure 4:
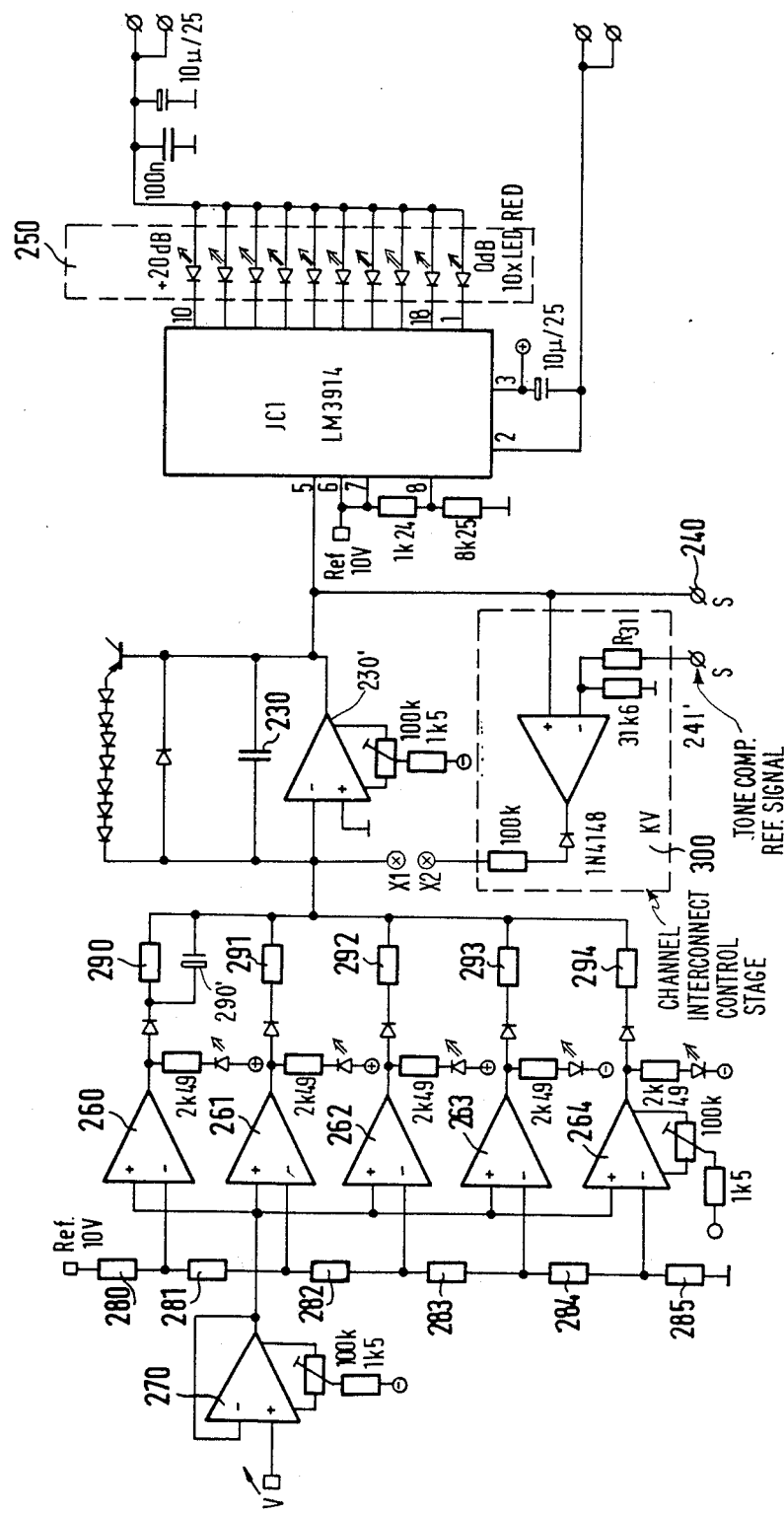
FIG. 4 is a more detailed diagram of the portion shown in FIG. 3.

FIG. 4 shows a detail of the circuit of FIGS. 2 and 3. The comparator circuits 260–264 are shown as operational amplifiers, receiving the input voltage V through a buffer amplifier 270. A voltage divider chain 280–285 is connected between a reference voltage and ground or chassis and determines five threshold levels. Resistors 290-294 in the outputs of the comparators determine the rate of change or speed of change associated with each threshold level which will appear at the output 240 of integrator 230 and, thus, control the equalizer adjustment. The first operational amplifier 260 has a capacitor 290' connected in parallel to the resistor 290 which, in case of response of operational amplifier 260, results in rapid and abrupt drop of the equalizer position by 7 dB. Response of the comparator or operational amplifier 260 occurs when the program audio signal is 15 dB above the disturbance signal. This rapid drop of the equalizer adjustment may be compared to an emergency volume control.

The diode-transistor chain connected in parallel to the integrating capacitor 230, and forming the integrator, limits the output voltage to a maximum of 10 volts.

The LED display 250 is driven by a driver circuit JC1, LM3914, which is a standard component.

The direct input to the operational amplifier 230', forming part of the integrator 230, is interrupted at terminal X1. The output signal from the integrator 230, available at terminal 240, is connected to an operational amplifier forming part of the tone compensation interconnect circuit 300. The output terminal of the operational amplifier of the tone compensation or channel interconnection circuit is shown as X2 and is connected to a terminal X1 of the input to the integrator 231 (FIG. 2) of the mid-range channel. The output of integrator 231 of the mid-range channel, terminal 241, is then connected to a similar circuit 301 which, in turn, has its output connected to the input to the integrator 232 (FIG. 2). Terminal 241' is the respective reference signal with which the output signal from the respective channel is compared to determine if the next higher channel should be controlled for lesser damping if attenuation of the lower channel in the equalizer is excessively reduced.

FIG. 4, additionally, shows circuit components and voltage levels suitable for an actual construction of the circuit and using standard and commercially available components.

Various changes and modifications may be made within the scope of the inventive concept.

TABLE 1

|  | Bass Channel | Mid-range Channel | High, or treble Channel |
|---|---|---|---|
| Program Audio Signal: | | | |
| $t_{rise}$ | 1 ms | 1 ms | 1 ms |
| $t_{decay}$ | 1500 ms | 500 ms | 500 ms |
| Noise Signal: | | | |
| $t_{rise}$ | 1 ms | 1 ms | 50 ms |
| $t_{decay}$ | 500 ms | 300 ms | 200 ms |

TABLE 2

| Stage: | Bass Channel | Mid-Range Channel | High, or Treble Channel |
|---|---|---|---|
| +15 dB | 7,0 dB | 7,0 dB | 7,0 dB |
| +10 dB | 16,0 dB/s | 48 dB/s | 86 dB/s |
| +3 dB | 2,0 dB/s | 6 dB/s | 14 dB/s |
| −3 dB | 2,3 dB/s | 5 dB/s | 9 dB/s |
| −10 dB | 8,5 dB/s | 33 dB/s | 54 dB/s |

We claim:
1. System for background noise suppression upon reproduction of program audio signals in an audio circuit, particularly in a car radio, having
means (1) for providing said program audio signal;
means (2, 6; 3, 7) for transducing said program audio signals into acoustic output;
a signal path between said signal providing means and signal transducing means; and
means (10) for providing noise signals, representative of background noise to be suppressed,
and wherein said signal path comprises
a multi-channel equalizer means (11) for separating the program audio signals into a plurality of program audio signal frequency components, and for passing said program audio signal frequency com- ponents in a plurality of channels having a transfer amplitude which is controllable through the equalizer means;

a frequency analysis stage (12) including first bandpass means (100, 101, 102) receiving the audio signals for separating the process audio signals into a plurality of frequency bands;

first envelope detector means (200, 201, 202) separately detecting the envelopes of the respective program audio signal frequency bands;

second bandpass means (103, 104, 105) receiving the noise signals for separating the noise signals into a plurality of frequency bands, said second bandpass means having similar bandpass characteristics as said first bandpass means;

second envelope detector means (203, 204, 205) separately detecting the envelopes of the separated respective noise frequency bands;

divider means (210, 211, 212) separately comparing the detected envelopes of the noise frequency bands with the detected envelopes of the program audio frequency bands, and providing program audio signal/noise signal comparison signals; and a control stage (13) receiving said comparison signals and providing control output signals for each of said frequency bands, said control output signals being coupled (240, 241, 242; B) to the control inputs of the equalizer and controlling the transfer amplitude, change of the transfer amplitude and rate of the change of the transfer amplitude of the respective frequency bands passing through the equalizer as a function of said comparison signals.

2. The system of claim 1, wherein said divider means are analog divider means dividing instantaneous values of the respective envelope detector means connected thereto.

3. The system of claim 2, wherein said first and second envelope detector means have rise and decay time constants for, respectively, rising and decaying signals applied thereto from the respective bandpass means;

and wherein the time constants for a rising signal are shorter than the time constants for a decaying signal.

4. The system of claim 2, wherein said first and second envelope detector means have rise and decay time constants for, respectively, rising and decaying signals applied thereto from the respective bandpass means;

and wherein the decay time constants of the envelope detectors are shorter for higher frequency bands than for lower frequency bands.

5. The system of claim 1, wherein the control stage (13) comprises a plurality of multi-stage comparator circuits (220, 221, 222), each associated with and connected to receive the comparison signals in the respective frequency bands;

weighting means ($k_i$) connected to the respective stages of the comparator circuits (220, 221, 222) and adding means (265) adding the respectively weighted signals received from the weighting means; and integrator means (230) integrating the added signals and providing integrated output signals for coupling to said equalizer control input.

6. The system of claim 5, wherein the comparator circuits include operational amplifiers (260-264), receiving at one input the output signals of the respective divider means (210-212);

buffer amplifier means (270) interposed between the outputs of the respective divider means and the operational amplifiers;

voltage divider means (280-285) being coupled to a second input of the operational amplifiers, and providing voltage values of different magnitude to said operational amplifiers;

resistor coupling means (290-294) of respectively different values coupling the outputs of the operational amplifiers to said adder (265) and forming said weighting means, said resistor coupling means determining the integration speed and direction of said integrator means (230) for, respectively, controlling the transfer amplitude, change of the trnasfer amplitude, and rate of the change of the transfer amplitude of the program signals in the respective channels of the equalizer.

7. The system of claim 6, further including channel interconnection circuits (300-301) interconnecting the integrators (230, 231, 232) for modifying the integration behavior of integrators in the channels associated with higher frequency band upon substantial and rapid change of the control signal applied to the control inputs of the equalizer of a lower frequency band beyond predetermined values.

8. System for background noise suppresson upon reproduction of program audio signals in an audio circuit, particularly in a car radio, having means (1) for providing said program audio signal;

means (2, 6; 3, 7) for transducing said program audio signals into acoustic output;

a signal path between said signal providing means and signal transducing means; and means (10) for providing noise signals, representative of background noise to be suppressed, and wherein said signal path comprises a multi-channel equalizer means (11) for separating the program audio signals into a plurality of frequency bands and for passing said frequency bands in a plurality of transfer channels having a transfer amplitude which is controllable through the equalizer means;

means for separating the program audio signals and the noise signals into a plurality of respective audio program signal components and noise signal components of respectively different frequency bands, and corresponding essentially to the frequency bands of the multi-channel equalizer;

means for comparing, within like frequency bands, the respective noise signal components and the program audio signal components and deriving a plurality of control comparison signals; and means for receiving the comparison control signals and providing control output signals for each of the frequency bands, said control output signals being coupled to control inputs of the equalizer means and controlling the transfer amplitude, change of the transfer amplitude and rate of the change of the transfer amplitude of the respective frequency bands passing through the equalizer means as a function of said comparison signals.

9. The system of claim 8, further comprising an analysis stage (12), said means (103-105) for separating the program audio signal and the noise signal into the respective frequency bands and said means for comparing forming part of said analysis stage bands; and said analysis stage further including means (200-205) demodulating said program audio signals, and said noise signals, in said frequency bands and providing demodulated envelope curves to said means for comparing, for comparing the instantaneous values of the demodulated program audio signals and the noise signals within the respective frequency bands.

10. Method of suppressing background noise upon reproduction of program audio signals in audio reproduction equipment, particularly car radios, comprising the steps of separating the program audio signals into a plurality of channels of respectively different frequency bands;

deriving (10) background noise signals and separating said background noise signals into a plurality of frequency bands, corresponding in band frequency to said separated program audio signals;

comparing the instantaneous values, in the respective frequency bands, of the noise signals with the program audio signals, and deriving a plurality of comparison control signals in the respective frequency bands ($V_B$, $V_M$, $V_H$);

receiving the comparison control signals and providing control output signals for each of the frequency bands;

coupling said control output signals to control inputs of a multi-channel equalizer having a controllable transfer amplitude; and controlling the transfer amplitude, change of the transfer amplitude and rate of the change of the transfer amplitude of the respective frequency bands passing through the equalizer as a function of said comparison signals.

11. The method of claim 10, wherein said control step includes determining signal rise and signal drop-off or decay of said comparison control signals;

and controlling the rate of change of the signals passing through the equalizer to result in decay times which are longer than said rise times both for the program audio signal and the noise signal.

12. The method of claim 11, wherein said control step comprises controlling the decay times to be shorter for higher frequency bands than for the lower frequency bands.

* * * * *